(12) United States Patent
Goto et al.

(10) Patent No.: US 8,240,346 B2
(45) Date of Patent: Aug. 14, 2012

(54) PURGE APPARATUS

(75) Inventors: Fumiki Goto, Aichi (JP); Naruto Adachi, Aichi (JP)

(73) Assignee: Murata Machinery, Ltd., Kyoto (JP)

( * ) Notice: Subject to any disclaimer, the term of this patent is extended or adjusted under 35 U.S.C. 154(b) by 568 days.

(21) Appl. No.: 12/497,019

(22) Filed: Jul. 2, 2009

(65) Prior Publication Data

US 2010/0000625 A1  Jan. 7, 2010

(30) Foreign Application Priority Data

Jul. 3, 2008 (JP) ................................ 2008-175105

(51) Int. Cl.
*B65B 31/04* (2006.01)

(52) U.S. Cl. .................... 141/65; 141/7; 141/8; 141/98; 141/192; 141/356

(58) Field of Classification Search .................. 141/7, 8, 141/59, 65, 98, 192, 351, 356; 414/217, 414/217.1; 206/710–712
See application file for complete search history.

(56) References Cited

U.S. PATENT DOCUMENTS

| | | | | |
|---|---|---|---|---|
| 5,810,062 A | * | 9/1998 | Bonora et al. | 141/351 |
| 5,988,233 A | * | 11/1999 | Fosnight et al. | 141/63 |
| 6,056,026 A | * | 5/2000 | Fosnight et al. | 141/98 |
| 6,123,120 A | * | 9/2000 | Yotsumoto et al. | 141/65 |
| 6,135,168 A | * | 10/2000 | Yang et al. | 141/98 |
| 6,418,979 B1 | * | 7/2002 | Lewis et al. | 141/4 |
| 6,996,453 B2 | * | 2/2006 | Ahn et al. | 700/213 |
| 2002/0194995 A1 | | 12/2002 | Shiramizu | |
| 2003/0049101 A1 | | 3/2003 | Seita | |
| 2011/0214778 A1 | * | 9/2011 | Natsume et al. | 141/4 |

FOREIGN PATENT DOCUMENTS

| | | |
|---|---|---|
| EP | 1 050 904 | 11/2000 |
| JP | 62-21237 | 1/1987 |
| JP | 7-130831 | 5/1995 |
| JP | 11-168135 | 6/1999 |
| JP | 2000-188320 | 7/2000 |
| JP | 2001-31212 | 2/2001 |
| JP | 2003-7813 | 1/2003 |
| JP | 2004-119488 | 4/2004 |
| JP | 2005-167168 | 6/2005 |
| JP | 2007-227800 | 9/2007 |

OTHER PUBLICATIONS

European Search Report issued Jul. 19, 2010 in European Application No. EP 09 16 4360 which is a foreign counterpart of the present application.

* cited by examiner

*Primary Examiner* — Timothy L Maust
(74) *Attorney, Agent, or Firm* — Wenderoth, Lind & Ponack, LLP

(57) ABSTRACT

A purge apparatus is provided which can purge with clean gas even in a case where an in-use state is selected after a long period of a non-use state. The purge apparatus includes a nozzle which is connectable to a container and through which gas passes, a detection unit which detects a connection state between the container and the nozzle, and a flow rate adjustment unit which allows the gas to flow at a first flow rate when the container and the nozzle are in a connected state, and allows the gas to flow at a second flow rate, which is lower than the first flow rate, when the container and the nozzle are in a disconnected state.

4 Claims, 6 Drawing Sheets

<1>

<2>

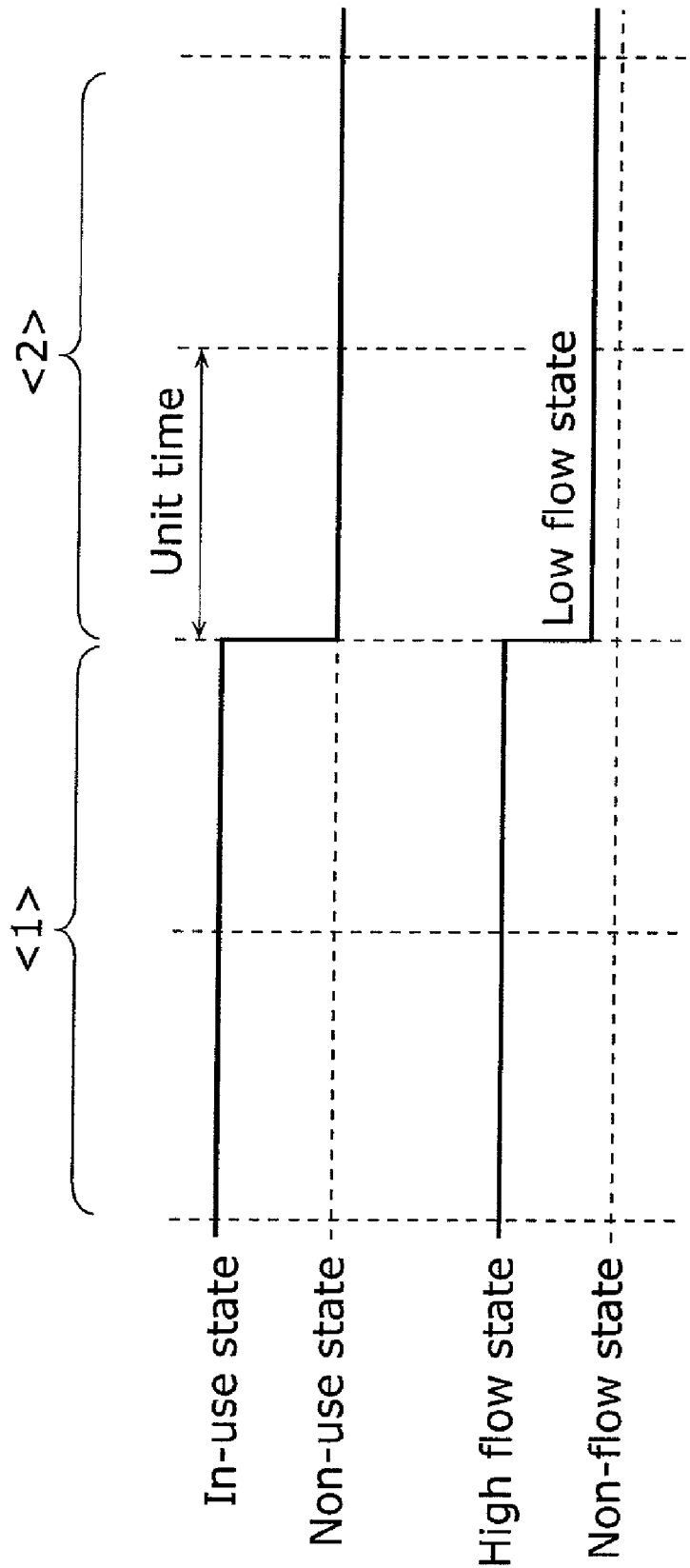

PURGE APPARATUS

BACKGROUND OF THE INVENTION (1) Field of the Invention

The present invention relates to a purge apparatus which maintains the cleanliness of the inside of a container used for storing reticles, wafers, glass substrates and the like in manufacturing a semiconductor device.

(2) Description of the Related Art

In the manufacturing process of a semiconductor device such as an LSI, it is necessary to store wafers, glass substrates, reticles and the like such that they do not become deteriorated or degenerated. For example, the wafers need to be stored in a low oxygen state to prevent oxidization, and the reticles need to be stored in an atmosphere where water ($H_2O$) is eliminated to suppress haze growth. Further, it is necessary to prevent particles from adhering on the wafers and the like as much as possible. Therefore, in most cases, the wafers and the like are stored in a container which is filled with clean gas that is composed of a type of gas compatible with the storage objects.

However, as in the case disclosed in Japanese Unexamined Patent Application Publication No. 2001-31212, the stored wafers may need to be sorted into several containers. In such a case, the container needs to be opened. Thus, a so-called "purge processing" is performed which introduces clean gas into the opened container and makes the internal atmosphere of the container a more positive pressure than the external atmosphere of the container, so that a high level of cleanliness can be maintained.

Further, since the reticles and the like are stored for a relatively long period of time, it is considered that storage in a container, on which purge processing is constantly performed, causes less particle contamination than storage in a sealed container. Therefore, purge apparatuses are available which can constantly provide a continuous purge to the container with clean gas.

However, even in the case where such a conventional purge apparatus is used, it is known that the wafers and the reticles being stored become contaminated with the particles on rare occasions. As a result of devoted research and effort, the inventors of the present invention have reached the finding that the particle contamination, which only rarely occurs, is caused by the purge apparatus. Furthermore, in the case where the purge apparatus is not used for a certain period of time, nozzles which discharge clean gas into the container become contaminated with the particles. When the container is purged by using the nozzles, the particles that adhered to the nozzles, while the nozzles were not in use, ingress the container, which results in contamination of the contained objects.

SUMMARY OF THE INVENTION

The present invention is conceived in view of the above findings, and it is an objective of the present invention to provide a purge apparatus which is capable of purging a container by discharging clean gas whenever the container is used.

In order to achieve the above objective, the purge apparatus according to the present invention is a purge apparatus which purges the inside of a container by introducing clean gas into the inside of the container, and which includes: a nozzle which is connected to the container, and through which the gas passes; a detection unit which detects a connection state between the container and the nozzle; and a flow rate adjustment unit which allows the gas to flow into the nozzle at a first flow rate when the detection unit detects that the container and the nozzle are in a connected state; and which allows the gas to flow into the nozzle at a second flow rate when the detection unit detects that the container and the nozzle are in a disconnected state, the second flow rate being lower than the first flow rate.

With this, the detection unit detects that the container and the nozzle are in a connected state (hereinafter, may be referred to as an "in-use state") and that the container and the nozzle are in a disconnected state (hereinafter, may be referred to as a "non-use state"). The flow rate adjustment unit continuously allows the gas to flow into the nozzle at the second flow rate even in the non-use state; and thus, it is possible to prevent the particles from adhering to the nozzle. Hence, even when the non-use state is changed to the in-use state, it is possible to avoid the inside of the container from becoming contaminated with the particles.

According to the present invention, even in the case where the purge apparatus has not been used for a certain period of time, it is possible to avoid, as much as possible, contaminating the inside of the container, which is a target to be purged when the purge apparatus is used.

Further Information about Technical Background to this Application

The disclosure of Japanese Patent Application No. 2008-175105 filed on Jul. 3, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings:

FIG. 7 is a timing chart showing a control state.

DESCRIPTION OF THE PREFERRED EMBODIMENTS

Next, embodiments according to the present invention will be described with reference to the drawings.

Embodiment 1

Figure 1:
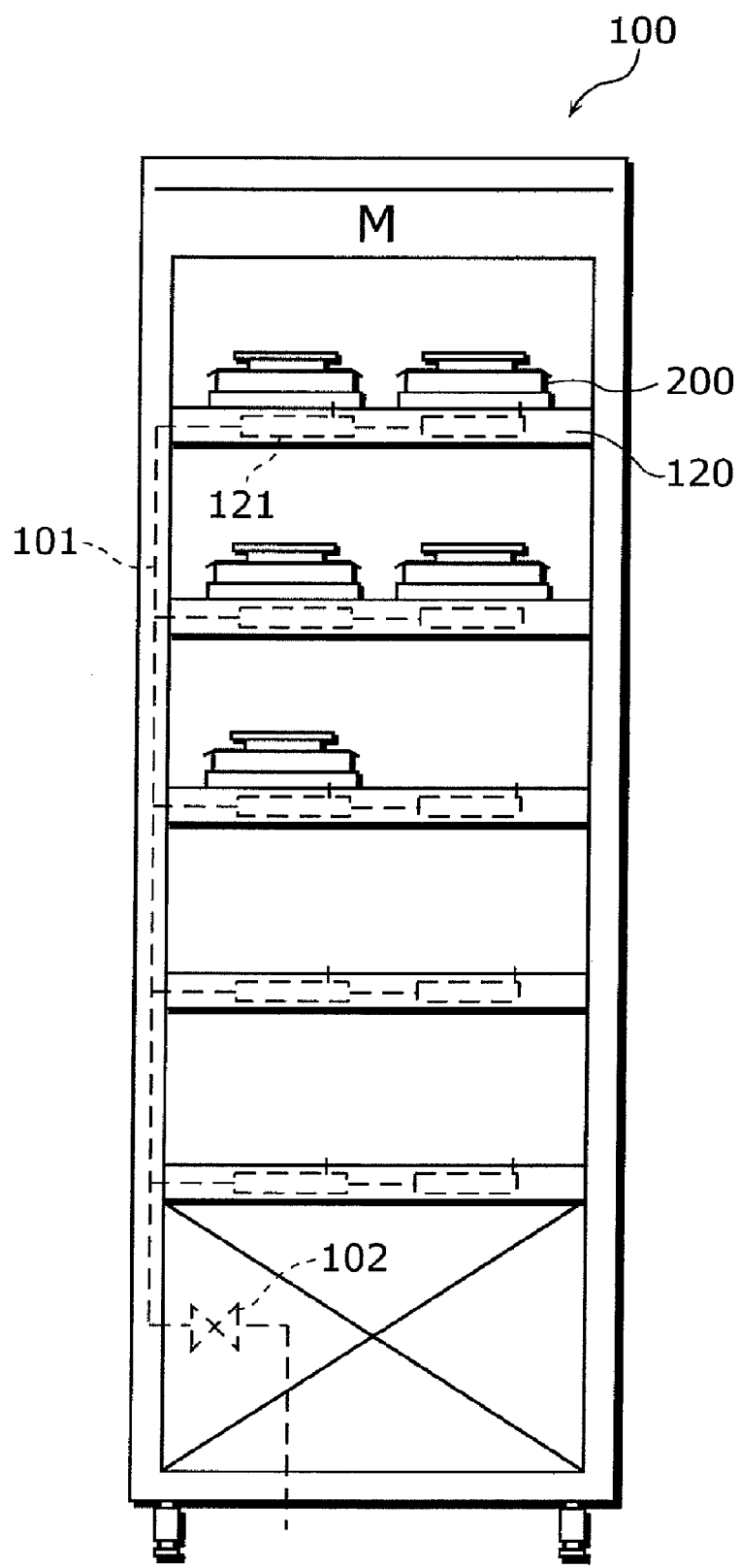
FIG. 1 is a front elevational view showing a purge apparatus according to an embodiment of the present invention.

FIG. 1 is a front elevational view showing a purge apparatus according to an embodiment of the present invention.

As shown in FIG. 1, a purge apparatus 100 is configured such that several containers 200 can be placed on respective shelf plates 120, and discharge units 121 are respectively provided inside of the shelf plates 120 which correspond to the position where the container 200 is placed. Each discharge unit 121 is connected to a pipe 101 for supplying a gas. The pipe 101 is attached to a main valve 102 which roughly adjusts the flow rate of gas to be supplied to each discharge unit 121.

Figure 2:
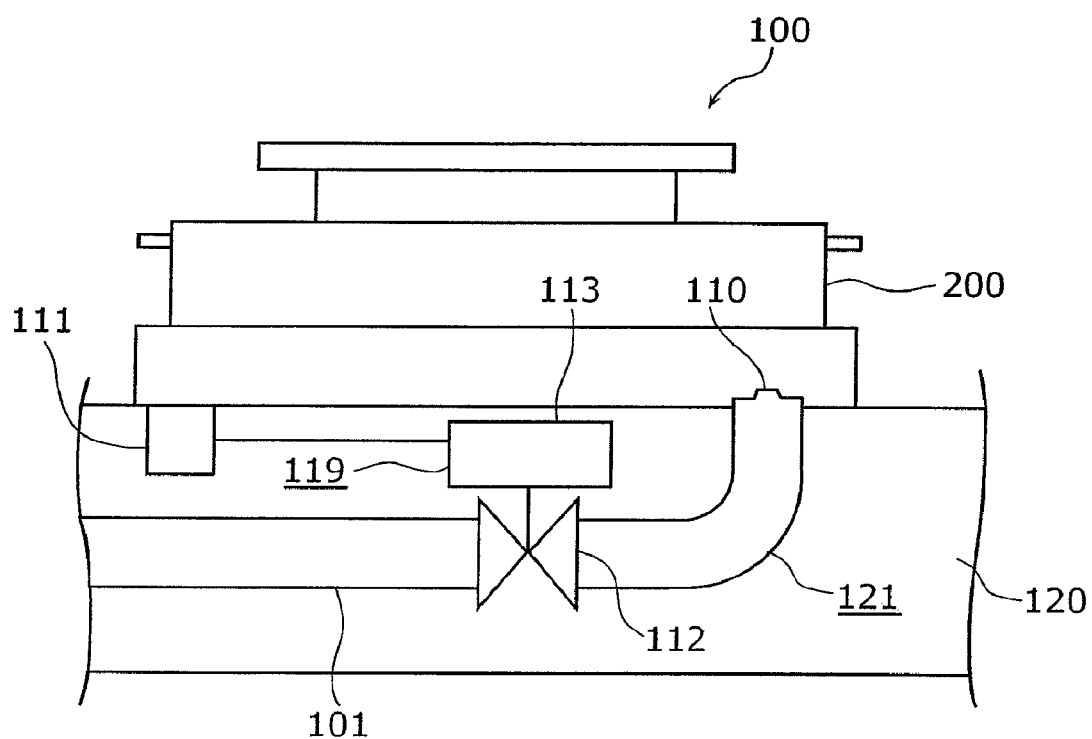
FIG. 2 is a diagram conceptually showing a discharge unit on which a container is being placed.

FIG. 2 is a diagram conceptually showing the discharge unit on which the container is being placed.

Figure 3:
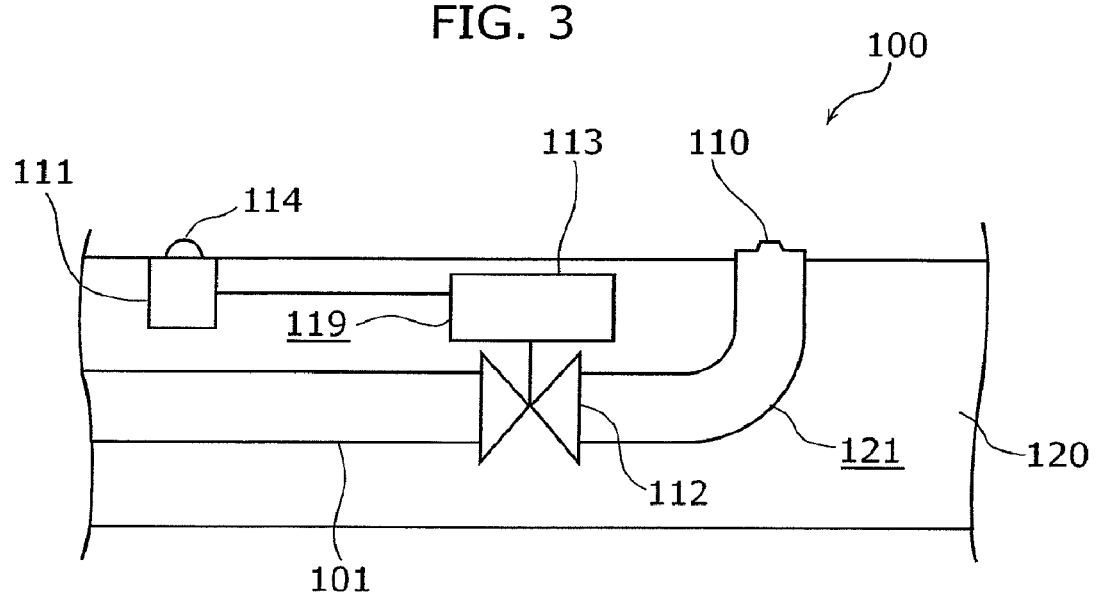
FIG. 3 is a diagram conceptually showing the discharge unit on which the container is not being placed.

FIG. 3 is a diagram conceptually showing the discharge unit on which the container is not being placed.

As shown in FIG. 2 and FIG. 3, the discharge unit 121 includes a detection unit 111, a switch valve 112, a control unit 113, and a nozzle 110. The switch valve 112 and the control unit 113 function as a flow rate adjustment unit 119.

The detection unit 111 is an apparatus which detects a connection state between the container 200 and the nozzle 110. In the present embodiment, the detection unit 111 is a microswitch. The detection unit 111 includes a protrusion 114 which is biased to protrude upward from the shelf plate 120 in the non-use state, and which is depressed when the container 200 is placed on the shelf plate 120. The protrusion 114 is adjusted by the protrusion amount and the like so that not only the case where the container 200 is simply placed on the shelf, but also the case where the container 200 and the nozzle 110 are connected, can be detected.

The switch valve 112 is a valve which is capable of switching between two states: a non-flow state in which gas is not allowed to flow into the nozzle 110; and a flow state in which gas is allowed to flow into the nozzle 110. The switch valve 112 can electrically switch between the two states, which are the non-flow state and the flow state, by solenoid operation.

The control unit 113 is an apparatus which is capable of controlling a time period, per unit time, during which the switch valve 112 is switched to the non-flow state, and a time period, per unit time, during which the switch valve 112 is switched to the flow state. The control unit 113 can establish, based on a signal from the detection unit 111, at least two modes: the mode in which the time period of the non-flow state per unit time is long; and the mode in which the time period of the non-flow state per unit time is short.

In the present embodiment, the control unit 113 is provided for each of the discharge units 121; however, it may be that the single control unit 113 controls several discharging units 121.

Figure 4:
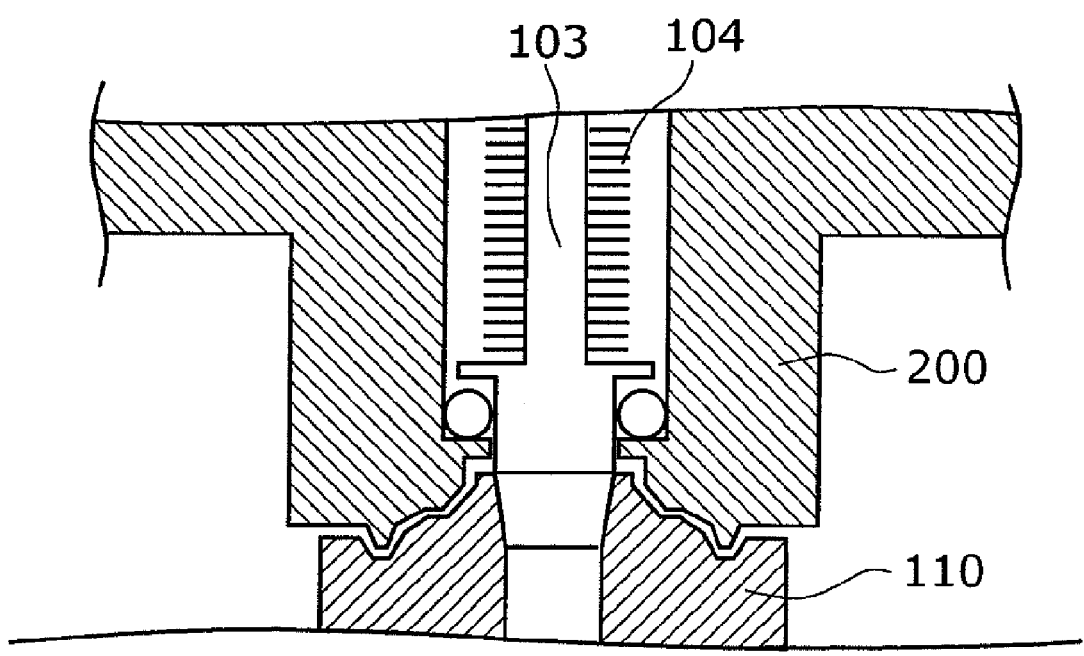
FIG. 4 is a cross-sectional view conceptually showing a connection part between a nozzle and the container.

FIG. 4 is a cross-sectional view conceptually showing the connection part between the nozzle and the container. As shown in FIG. 4, when the nozzle 110 and the container 200 are in the connected state, an introduction valve 103 included in the container 200 is pushed up, and gas discharged through the nozzle 110 can be introduced into the container. On the other hand, when the nozzle 110 and the container 200 are in the disconnected state, the introduction valve 103 is pushed down by a spring 104 to block the opening of the container 200.

Figure 5:
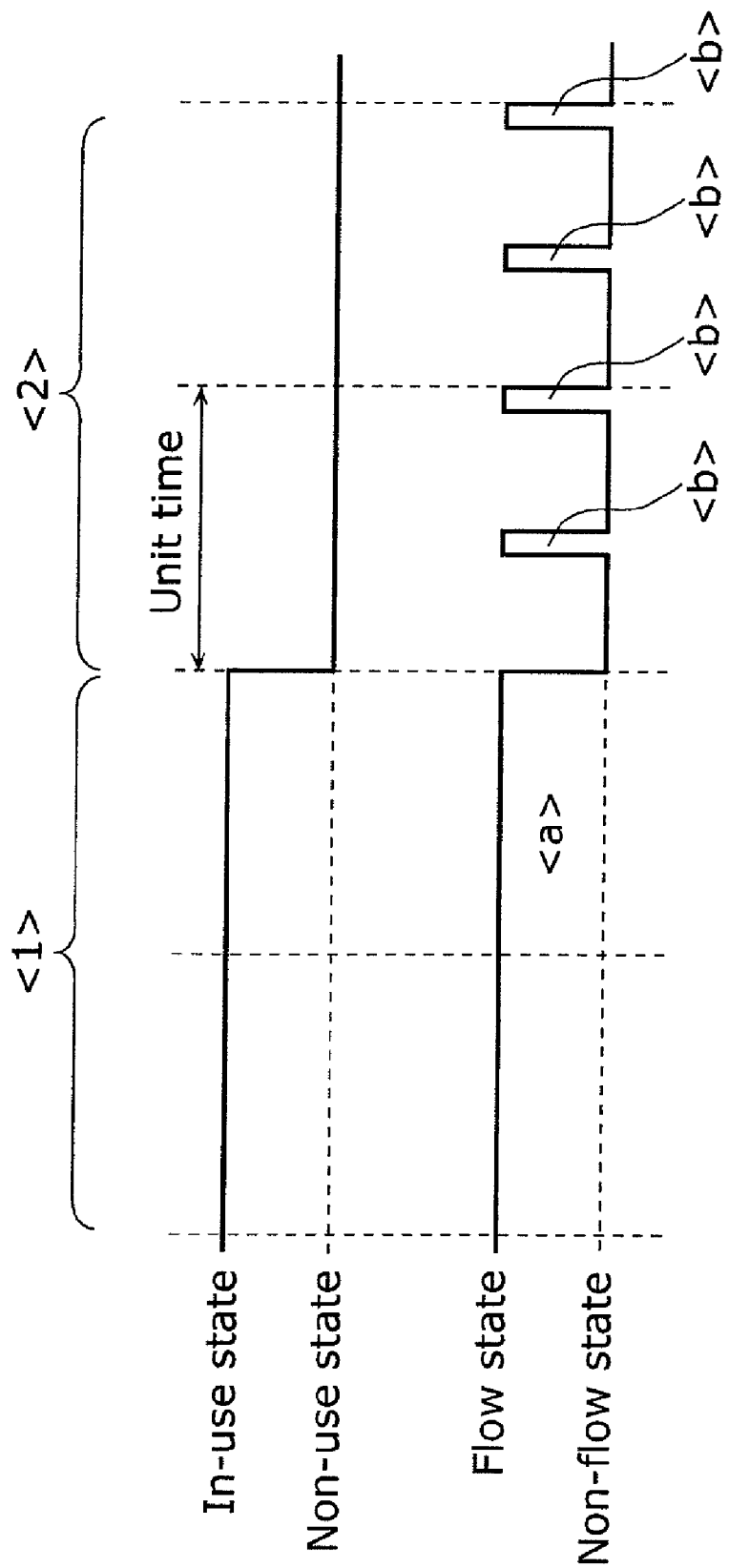
FIG. 5 is a timing chart showing details of the control of a control unit.

FIG. 5 is a timing chart showing details of the control of the control unit. As shown in FIG. 5, in the state where the control unit 113 detects the in-use state (<1> in FIG. 5), that is, the state where the protrusion 114 of the detection unit 111 is pushed down by the container 200 connected to the nozzle 110, the control unit 113 controls the switch valve 112 so that the flow state is maintained. In this state, gas is flowing in the nozzle 110 at a first flow rate. Here, the first flow rate refers to the total volume of gas allowed to flow into the nozzle 110 per unit time, and corresponds to the area of the rectangular portion (<a> in FIG. 5) which is enclosed by the solid line and the dashed line.

Next, in the state where the control unit 113 detects the non-use state (<2> in FIG. 5), that is, the state where the container 200 is removed from the shelf plate 120 of the purge apparatus, the control unit 113 controls the switch valve 112 so that the flow state occurs once or several times in a pulsed state per unit time (in FIG. 5, the case where the flow state occurs twice per unit time is shown). In this state, gas is flowing in the nozzle 110 at a second flow rate. Here, the second flow rate refers to the total volume of gas allowed to flow into the nozzle 110 per unit time, and corresponds to the area of the strip shaped portion indicated by <b> which is included in the unit time.

According to the purge apparatus 100 described above, it is possible to purge the inside of the container 200 by discharging gas at the first flow rate to the part on which the container 200 is placed. On the other hand, as for the part on which the container 200 is not placed, gas is continuously allowed to flow into the nozzle 110. As a result, the gas is discharged at the second flow rate. Hence, it is possible to prevent the particles from adhering to the nozzle 110 even in the non-use state. In addition, even when the nozzle is in the in-use state after a continuous period of the non-use state, it is possible to prevent particles from adhering to the nozzle 110 be introduced into the container 200 and the contained objects, such as reticles, from becoming contaminated. Further, since there is no need to be concerned with the particles adhering to the nozzle 110, it is not necessary to keep the surrounding atmosphere of the purge apparatus 100 in a highly clean state such as ISO class 3, which contributes to cost reduction in a factory as a whole.

Further, according to the present embodiment, regardless of the configuration of the nozzle 110, it is only necessary to connect, to the nozzle 110, the switch valve 112 which switches between two states which are open and closed; and thus, the above advantageous effects can be obtained with a simple structure. Further, in the case where the gas is allowed to flow at the second flow rate, the second flow rate can be adjusted by simply adjusting the time period of the flow state. Therefore, for example, in the case where relatively expensive gas is allowed to flow, detailed adjustment of the flow rate is possible.

In the present invention, types of the gas allowed to flow into the nozzle 110 are not particularly limited; however, in the case where the reticles are purged, the preferable gas to be used is clean dry air. This is because the reticles have a small risk of oxidization caused by air. Further, in the case where the wafers are purged, the preferable gas to be used is an inert gas such as nitrogen. This is because the wafers have a high risk of oxidization. Further, the clean gas refers to a gas which is in the state where the number of the particles per unit volume included in the gas is 0 or minuscule. Examples of such gas include air in which several kinds of gasses are mixed, and gas composed of a single type of gas.

Embodiment 2

Figure 6:
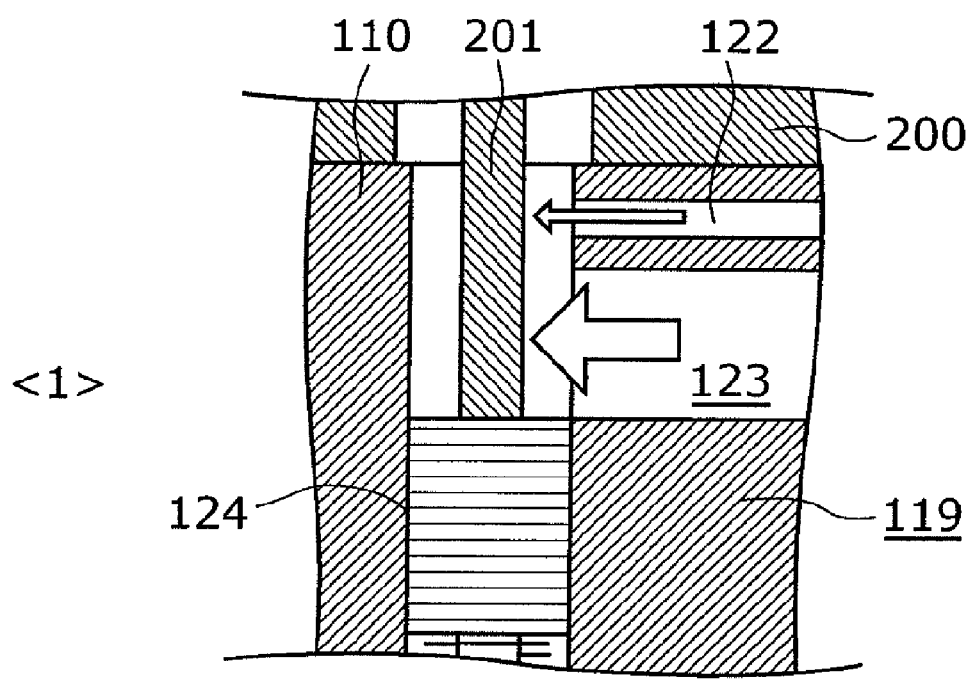
FIG. 6 is a cross-sectional view conceptually showing a nozzle according to another embodiment, and <1> shows an in-use state and <2> shows a non-use state.
Figure 6:
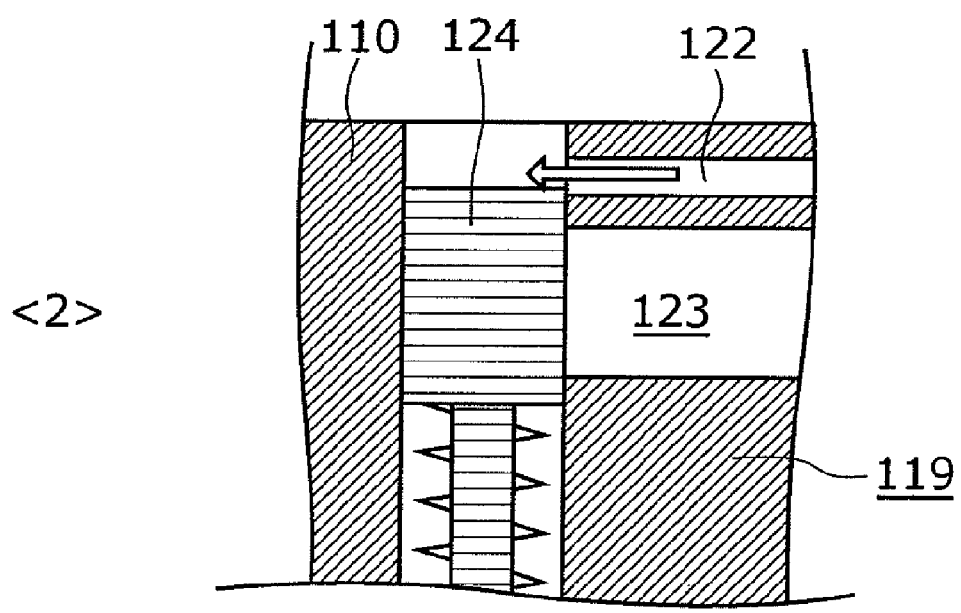

Next, other embodiments according to the present invention will be described. FIG. 6 is a cross-sectional view conceptually showing a nozzle according to the present embodiment, and <1> shows an in-use state and <2> shows a non-use state.

As shown in FIG. 6, the inside of a nozzle 110 is cylindrical, and a piston 124 is slidably attached to the inside of the nozzle 110. Furthermore, the nozzle 110 has a sidewall provided with a first opening 122 and a second opening 123 for supplying gas into the nozzle 110.

As shown in <1> of FIG. 6, in the case of the in-use state where the container 200 and the nozzle 110 are connected, a rod 201, which extends downward in a protruding manner from the container 200, pushes down the piston 124, and opens both the first opening 122 and the second opening 123. This results in a high flow state where the gas is allowed to flow into the nozzle 110 at a first flow rate.

On the other hand, as shown in <2>, in the case of the non-use state where the container 200 and the nozzle 110 are disconnected, the piston 124 slides upward due to the spring force, and closes only the second opening 123. This results in a low flow state where the gas is allowed to flow into the nozzle 110 at a second flow rate.

In other words, the inside of the cylindrical nozzle 110, the piston 124, the first opening 122, and the second opening 123 function as a switch valve which is capable of switching between two states: the high flow state where gas is allowed to flow into the nozzle 110 at the high flow rate; and the low flow state where gas is allowed to flow into the nozzle 110 at the lower flow rate.

Further, the piston 124 also functions as a detection unit for detecting a connection state between the container 200 and the nozzle 110, as well as functioning as a control unit for controlling the switch valve so that the high flow state is produced when the gas is allowed to flow into the nozzle 110 at the first flow rate and the low flow state is produced when the gas is allowed to flow into the nozzle 110 at the second flow rate.

As described, the inside of the cylindrical nozzle 110, the piston 124, the first opening 122 and the second opening 123 function as the flow rate adjustment unit 119. In other words, the present invention includes not only the cases where the connection state between the container 200 and the nozzle 110 is electrically detected, and the flow rate of gas allowed to flow into the nozzle 110 is controlled, but also the cases where the connection state between the container 200 and the nozzle 110 is mechanically detected, and the flow rate of gas allowed to flow into the nozzle 110 is controlled.

FIG. 7 is a timing chart showing a control state. As shown in FIG. 7, in the state where the in-use state is detected, that is, the state where the rod 201 of the container 200 is pushing down the piston 124 (<1> in FIG. 6), the piston 124 functioning as the control unit 113 opens both the first opening 122 and the second opening 123 to provide the high flow state. In this state, the gas is constantly flowing into the nozzle 110 at the first flow rate.

Next, in the state where the control unit 113 detects the non-use state, that is, the state where the rod 201 of the container 200 is separated from the piston and the piston 124 is pushed up (<2> in FIG. 6), the piston 124 functioning as the control unit 113 closes the second opening 123. In this state, gas is constantly flowing into the nozzle 110 at the second flow rate.

According to the purge apparatus 100 as described above, it is possible to constantly discharge the gas into the container 200 at the first flow rate in the in-use state where the container 200 and the nozzle 110 are connected, which allows purging of the inside of the container 200. On the other hand, in the non-use state where the container 200 and the nozzle 110 are disconnected, the gas is constantly discharged at the second flow rate. Therefore, even in the non-use state, the second flow rate of gas can prevent the particles from adhering to the nozzle 110. As a result, even after a continuous non-use state, it is possible to avoid the particles from adhering to the nozzle 110 and being introduced into the container 200 and contaminating the contained objects such as reticles.

Further, according to the present embodiment, electronic control is not necessary, which allows higher reliability, and wiring or the like in manufacturing the purge apparatus 100 is not necessary, which contributes to improved manufacturing efficiency.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The present invention can be applied in a purge apparatus which introduces clean gas into a container that contains reticles, wafers, and glass substrates for display apparatuses that require avoidance of particle contamination.

What is claimed is:

1. A purge apparatus for purging an inside of a container by introducing clean gas into the inside of the container, said purge apparatus comprising:
   a nozzle adapted to be connected to the container, and through which the gas passes;
   a detection unit configured to detect a connection state between the container and said nozzle; and
   a flow rate adjustment unit configured to: allow the gas to flow into said nozzle at a first flow rate when said detection unit detects that the container and said nozzle are in a connected state; and allow the gas to flow into said nozzle at a second flow rate when said detection unit detects that the container and said nozzle are in a disconnected state,
   the second flow rate being lower than the first flow rate and higher than zero, wherein said first and second flow rates are determined as average flow rates over the time in which said first and second flow rates are adopted, respectively.

2. The purge apparatus according to claim 1,
   wherein said flow rate adjustment unit includes:
   a switch valve for switching between a non-flow state and a flow state, the non-flow state being a state where the gas is not allowed to flow into said nozzle, the flow state being a state where the gas is allowed to flow into said nozzle; and
   a control unit configured to control a total time-duration, per certain time-period, during which said switch valve is switched to the non-flow state,
   wherein, when said detection unit detects that the container and said nozzle are in the connected state, said control unit is configured to select a first mode, and
   when said detection unit detects that the container and said nozzle are in the disconnected state, said control unit is configured to select a second mode,
   wherein the total time-duration of the non-flow state included in a certain time-period is shorter in said first mode than in said second mode, thereby allowing the gas to flow into said nozzle at said first and second flow rates in said first and second modes, respectively.

3. The purge apparatus according to claim 1,
   wherein said flow rate adjustment unit includes:
   a switch valve for switching between a high flow state and a low flow state, the high flow state being a state where the gas is allowed to flow into said nozzle at a high flow rate, the low flow state being a state where the gas is allowed to flow into said nozzle at a lower flow rate than the high flow rate; and
   a control unit configured to control said switch valve so that the high flow state is when the gas is allowed to flow into said nozzle at said first flow rate, and the low flow state is when the gas is allowed to flow into said nozzle at said second flow rate.

4. A purge method for use with a purge apparatus to purge an inside of a container by introducing clean gas into the inside of the container, the purge apparatus including a nozzle which is connected to the container and through which the gas passes, and a detection unit which detects a connection state between the container and the nozzle, said purge method comprising:

allowing the gas to flow into the nozzle at a first flow rate when the detection unit detects that the container and the nozzle are in a connected state; and allowing the gas to flow into the nozzle at a second flow rate when the detection unit detects that the container and the nozzle are in a disconnected state, the second flow rate being lower than the first flow rate, wherein the second flow rate is lower than the first flow rate and higher than zero, and said first and second flow rates are determined as average flow rates over the time in which said first and second flow rates are adopted, respectively.

* * * * *